United States Patent
Chung et al.

(10) Patent No.: US 7,204,686 B2
(45) Date of Patent: *Apr. 17, 2007

(54) PARALLELISM ADJUSTMENT DEVICE

(75) Inventors: Yong-Chen Chung, Hsinchu (TW); Chia-Hung Lin, Hsinchu (TW); Chuan-Feng Chen, Hsinchu (TW); Chia-Chun Hsu, Hsinchu (TW); Wen-Hung Feng, Hsinchu (TW); Ming-Chi Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 281 days.

This patent is subject to a terminal disclaimer.

(21) Appl. No.: 10/663,655

(22) Filed: Sep. 17, 2003

(65) Prior Publication Data

US 2004/0219461 A1    Nov. 4, 2004

(30) Foreign Application Priority Data

May 2, 2003    (TW)    .............................. 92208079 U

(51) Int. Cl.
B29C 59/02    (2006.01)
(52) U.S. Cl. .................. 425/385; 425/389; 425/405.1; 425/408; 425/DIG. 19
(58) Field of Classification Search ................ 425/385, 425/389, 405.1, 406, 408, 415, DIG. 19; 100/211
See application file for complete search history.

(56) References Cited

U.S. PATENT DOCUMENTS 5,558,015 A * 9/1996 Miyashita et al. .......... 100/211
5,648,109 A * 7/1997 Gutowski et al. ........... 425/389
5,947,027 A * 9/1999 Burgin et al. ............... 101/474
5,993,189 A    11/1999 Mueller et al.
6,482,742 B1    11/2002 Chou
6,787,071 B2 * 9/2004 Gorczyca et al. ........... 425/810

FOREIGN PATENT DOCUMENTS

| WO | WO 01/42858 | 6/2001 |
| WO | WO 01/69317 | 9/2001 |

* cited by examiner

Primary Examiner—Yogendra N. Gupta
Assistant Examiner—Thu Khanh T. Nguyen
(74) Attorney, Agent, or Firm—Rabin & Berdo, P.C.

(57) ABSTRACT

A parallelism adjustment device applicable to nano-imprint lithography has an imprint unit, a carrier unit, a parallelism adjustment mechanism, and a driving source. The imprint unit has a first molding plate and an imprinting mold mounted on the first molding plate. The carrier unit has a second molding plate and a substrate mounted on the second molding plate. The parallelism adjustment mechanism has an enclosed resilient film and a fluid filled therein, and is coupled to at least one of the first and second molding plates. The driving source drives at least one of the imprint unit and the carrier unit to form contact between the mold and the moldable layer. The parallelism adjustment device is pressed via the contact to adjust parallelism for the imprint mold and the substrate and uniformly distributes the pressure between the mold and the substrate, making the molding quality of nano-imprint lithography significantly improved.

12 Claims, 6 Drawing Sheets

PARALLELISM ADJUSTMENT DEVICE

FIELD OF THE INVENTION

The present invention relates to a parallelism adjustment device applicable to nano-imprint lithography, and more particularly, to a parallelism adjustment device that quickly responds and easily operates.

BACKGROUND OF THE INVENTION

As the demand for producing smaller line widths of integrated circuit increases, the use of conventional photolithography process to define line widths that are smaller than the wavelength of light for implementing nano-scale features becomes increasingly difficult due to the diffraction of light. Although subnano-scale features have also been studied, they still cannot be implemented in mass production because the current commercially available manufacturing equipment is not compatible with the subnano-scale process. Therefore, a nano-imprint lithography (NIL) has been developed to meet the requirements for processing fine line widths, wherein the technology is adaptable to low-cost mass production utilizing an enlarged feature-processing area.

Nano-imprint lithography uses an imprint force to transfer nano-scale features that are previously formed on a mold onto a moldable layer applied on a substrate. The moldable layer is made of a polymer such as polymethyl methacrylate (PMMA). After the moldable layer is molded, a plurality of semiconductor processes are subsequently applied to define a device with nano-scale line widths. FIG. 3A to FIG. 3C schematically illustrate the process of nano-imprint lithography, including heating, imprinting, cooling and demolding steps. In the heating step illustrated in FIG. 3A, a moldable layer 23 applied over a substrate 21 is heated to the required operating temperature. During the imprinting step of FIG. 3B, a mold 11 with nano-scale features 13 are mounted on a first molding plate 12, and a substrate 21 is mounted on a second molding plate 26. The mold 11 moves towards the substrate 21 by means of a driving source 14. When the mold 11 comes into contact with and then presses the moldable layer on the substrate 21, the features on the mold 11 are transferred onto the moldable layer 23. After the moldable layer 23 cools down to an appropriate temperature, the moldable layer 23 is demolding from the mold 11, as shown in FIG. 3C. Thereby, the nano-imprint lithography is accomplished.

For this recently developed technology, parallelism between the mold and the substrate and uniformity of imprint force applied during imprinting are crucial to the imprinting quality. Specifically, since the mold and the substrate are respectively mounted on the first and second molding plates, the uniformity of the applied imprinting force is determined on the basis of the pressure distribution of the first and second molding plates. Therefore, if the pressure distribution on the molding plates and the parallelism between the mold and the substrate are not adequately controlled, the imprinting precision is adversely affected, and the nano-scale features on the mold or even the substrate will be damaged. Compared to conventional hot embossing, the nano-imprint lithography requires higher imprint precision, higher parallelism and uniformity of imprint pressure. The current processing apparatus does not meet the high requirements of nano-imprint lithography.

FIG. 4 shows an apparatus for molding microsystem structures disclosed in U.S. Pat. No. 5,993,189. A mold 63 having nano-scale features are mounted on an upper carrier 61, while a substrate 64 is mounted on a lower carrier 62. The lower carrier 62 moves upward under guide 65 to perform imprinting. In this apparatus, no parallelism adjustment device is provided. Therefore, the parallelism between the mold 63 and the substrate 64 is not ensured due to possible manufacturing errors or an improper assembly of components such as the mold and guide.

FIG. 5 shows of a molding apparatus disclosed in PCT patent No. WO 0169317. An imprint mold 71 and a substrate 72 are respectively connected to individual oil hydraulic cylinders 73, 74. The mold 71 comes into contact with the substrate 72 by means of the cylinder 73 to effect the imprint process. With the limited resilience of an O-ring 76 installed inside the oil hydraulic cylinder 75, the mold 71 and the substrate 72 are subject to a shift in parallelism adjustment before contacting each other. The use of the oil hydraulic cylinders 75, 77 makes the whole structure and operation complex. Furthermore, the oil hydraulic system has disadvantages such as poor control response.

FIG. 6 shows the fluid pressure imprint lithography disclosed in U.S. Pat. No. 6,482,742, which has problems similar to the above. An elastic sealing member 81 seals a mold 82 and a substrate 83 stacked together. After the stack is placed in a pressure chamber 84, a fluid is charged in the pressure chamber 84 through an inlet 85. Thus, the imprint process is achieved by the fluid pressure. Thereafter, the fluid is drained through an outlet 86 and the substrate 83 is removed. The sealing and imprinting of this apparatus are complex and time-consuming, which is unfavorable to efficient mass production. Furthermore, since the processing of the mold 82 and the substrate 83 requires stacking, sealing, transferring into the pressure chamber, and a pressure increasing and decreasing steps, it is difficult to achieve precision alignment due to the combined variability of all the processing steps.

FIG. 7 shows a molding apparatus disclosed in PCT patent WO 0142858. A pressure chamber 92 is mounted under the substrate 91. A resilient film 93 is established between the pressure chamber 92 and the substrate 91. A highly pressurized liquid is charged in the pressure chamber 92 to perform the imprint process. This method is complex and requires generating high pressure, which consumes a lot of energy and may cause environmental pollution.

Therefore, there is a need for a parallelism adjustment device suitable for nano-imprint lithography providing reduced manufacturing and assembly errors, uniformity of imprint pressure, and improved nano-imprint quality. Furthermore, the parallelism adjustment device should have a simple construction that can respond quickly and easily, and that can be manufactured and operated at low cost.

SUMMARY OF THE INVENTION

A primary objective of the invention is to provide a parallelism adjustment device that provides a highly uniform imprint pressure in the nano-imprint lithography.

Another objective of the invention is to provide a parallelism adjustment device that does not cause damage to molds and substrates.

Still another objective of the invention is to provide a parallelism adjustment device that has a simple construction and can be manufactured at low cost.

A further objective of the invention is to provide a parallelism adjustment device which responds instantly.

A further objective of the invention is to provide a parallelism adjustment device that does not require preliminary preparation and can be operated easily.

In accordance with the above and other objectives, the parallelism adjustment device applicable to nano-imprint lithography of the invention includes an imprint unit, a carrier unit, a parallelism adjustment mechanism, and a driving source. The imprint unit is at least provided with a first molding plate and an imprinting mold mounted on the first molding plate. The carrier unit is at least provided with a second molding plate and a substrate mounted on the second molding plate. The parallelism adjustment mechanism includes an enclosed resilient film and a fluid filled therein, and is attached on at least one of the first and second molding plates. The driving source is used to drive the imprint unit and the carrier unit to allow a contact to be formed between the mold and the moldable layer, and to allow parallelism adjustment for the mold and the substrate.

And while the parallelism adjustment mechanism has to be secured between the first molding plate and the imprinting mold if the parallelism adjustment mechanism is to be mounted on the first molding plate. The parallelism has to be secured between the second molding plate and the substrate if the parallelism mechanism is to be mounted on the second molding plate. As a result, the parallelism between the imprinting mold and the substrate is adjusted when the pressured is applied to the parallelism adjustment mechanism. The resilient film of the parallelism adjustment mechanism described above may be made of polymer materials, such as rubber and plastic or other flexible structures. The fluid that fills the resilient film may include any liquids or gases.

Furthermore, the parallelism adjustment mechanism includes a pressure sensor for sensing the applied pressure, so as to monitor the pressure instantly. With a pressure-time control curve previously established, the nano-imprinting process can be controlled. Meanwhile, the imprint unit and the carrier unit may be coupled to an alignment platform with a large area, so as to enhance the horizontal alignment in the imprinting process.

Accordingly, the parallelism adjustment device is proposed to achieve objectives such as high level of freedom, instant responsiveness, and no harm done to the mold and the substrate. After the imprint unit makes a contact with the carrier unit, non-uniform pressure distribution that occurs during the imprinting process is offset with the pressure exerted by the enclosed resilient membrane and the fluid. That is, when both the imprint unit and the carrier unit suffer from the poor parallelism, the parallelism may be adjusted passively via instant deformation of the resilient membrane, while such adjustment is can be made at wider angles without limited by the direction. With the property of the fluid, the pressure is evenly applied to the substrate of the carrier unit, in order to satisfy efficient and high quality imprinting requirements. And instead of placing in the closed chamber, the imprint unit and the carrier unit are operated independently, so complex preparations prior to the imprinting can be omitted. Accordingly, the present invention has a simple construction manufactured with a low cost, and the commercial demand is met for mass production at a rapid rate.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief description of the drawings is as follows.

DETAILED DESCRIPTION OF THE PREFERRED EMBODIMENTS

Figure 1:
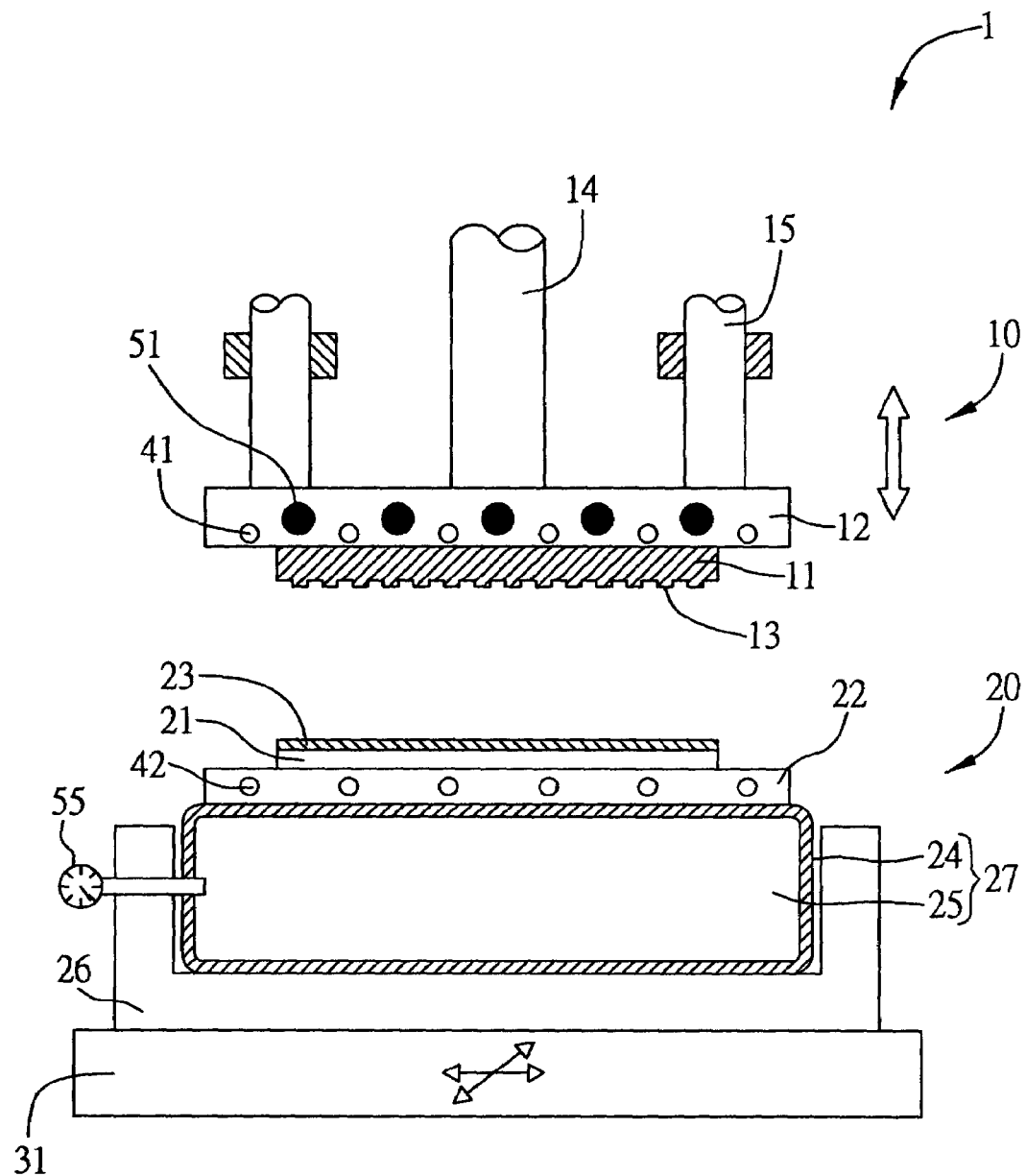
FIG. 1 is a schematic view of a parallelism adjustment device according to a first embodiment of the invention.

Wherever possible in the following description, like reference numerals will refer to like elements and parts unless otherwise stated.

FIG. 1 depicts a parallelism adjustment device 1 applicable to nano-imprint lithography (NIL) according to the first embodiment of the invention. The parallelism adjustment device 1 includes an imprint unit 10 consisting of a mold 11, a first molding plate 12 and a driving source 14. The imprint unit 10 moves toward a carrier unit 20 by means of a plurality of the guiding poles 15. At least one nano-scale feature 13 to be imprinted is previously formed on the mold 11. The carrier unit 20 includes a second molding plate 26 mounted on a positioning platform 31. A resilient film 24 capable of withstanding high pressure is formed inside the second molding plate 26, and hermetically enclosed therein. A fluid 25 fills up the resilient film 24 to form a parallelism adjustment mechanism 27. A substrate 21 coated with a moldable layer 23 is mounted on the carrier unit 20 via vacuum suction of a suction plate 22, such that the moldable layer faces opposite to the nano-scale features 13 of the mold 11.

The suction plate 22 has a pinhole (not shown). The suction plate 22 and the substrate 21 are placed together on the resilient film 26. Then, the substrate 21 is aligned with the mold 11 by means of the positioning platform 31 with horizontal positioning ability to increase precision of nano-imprint lithography. A plurality of heaters 51 is further mounted on the first molding plate 12. The heaters 51, preferably rapid heating units (not shown) mounted between the substrate 21 and the mold 11, increase the temperature of the moldable layer 23 up to a predetermined operating temperature for the imprint lithography. A mold cooling member 41 is also mounted on the first molding plate 12, while a substrate cooling member 42 is mounted on the suction plate 22. These cooling members 41, 42 serve to cool the mold 11 and the substrate 21 for mold release after the imprint lithography is completed.

In the parallelism adjustment device 1, a pressure sensor 55 is further mounted on the parallelism adjustment mechanism 27 to measure the pressure applied when the mold 11 comes into contact with the moldable layer 23, thereby monitoring the pressure during the imprint lithography. This is achieved via a predetermined pressure-time operation curve. When the pressure applied to the parallelism adjustment mechanism 27 is increased to a particular value and the mold 11 makes the contact with the moldable layer 23, the pressure is maintained at that value for several seconds. Thereafter, the mold 11 is removed to complete imprint lithography. The relationship between pressure and time can be obtained from experimental tests, depending on the imprint material and the desired imprint precision. The location for the pressure sensor 55 is not limited to that shown in FIG. 1. The pressure sensor 55 can be mounted anywhere as long as it can detect the pressure variation during imprint lithography.

The resilient film 24 in the parallelism adjustment mechanism 27 is made of a polymer such as rubber or plastic, or other flexible materials. The fluid 25 can be of any type of liquid or gas. The moldable layer 23 can be a polymeric material, or other moldable metallic or non-metallic material. The mold 11 and the substrate 21 are respectively positioned on the first and second molding plates 12, 26 by vacuum suction force, mechanical force, or electromagnetic force. Furthermore, the driving source 14 is constructed from, for example, a combination of a linear motor and a hydraulic cylinder, or a combination of a server motor, a ball screw rod, and other components.

The imprint lithography process performed by using the parallelism adjustment device 1 of the invention includes the following steps. The heaters 51 mounted on the first molding plate 12 and the rapid heating unit formed between the substrate 21 and the mold 11 (not shown), if any, increase the temperature of the moldable layer 23 up to an imprint operating temperature. The driving source 14 of the imprint unit 10 drives the first molding plate 12 and the mold 11 thereon to move toward the carrier unit 20 by means of the guiding poles 15. When the imprint unit 10 comes into contact with the carrier unit 20, one or more nano-scale features 13 on the mold 11 are pressed and then transferred to the moldable layer 23 on the substrate 21. Since the resilient film 24 of the carrier unit 20 is flexible, a parallelism adjustment is conducted passively according to the direction where imprint unit 10 exerts the pressure to achieve an ideal parallelism as the mold 11 makes the contact with the substrate 21. Therefore, the parallelism requirement is satisfied during the imprinting process. The fluid 25 in the resilient film 24 keeps the substrate 21 at a pressure as uniform as possible. When the driving source 14 slowly applies the pressure, the pressure sensor 55 on the resilient film 24 monitors the applied pressure to provide feedback to control the imprint force based on the predetermined pressure curve. After the imprint lithography is completed, a mold cooling member 41 of the first mold 12 and a substrate cooling member 42 of the suction plate 22, respectively, cool the mold 11 and the substrate 21 down to appropriate temperatures. Then, the driving source 14 drives the imprint unit 10 to release the moldable layer 23 from the mold 11 so as to complete the imprinting process. Furthermore, a highly evaporable anti-adhesion layer (not shown) may be coated between the mold 11 and the substrate 21, before the imprint lithography is performed, to facilitate the release of the moldable layer 23.

Figure 2:
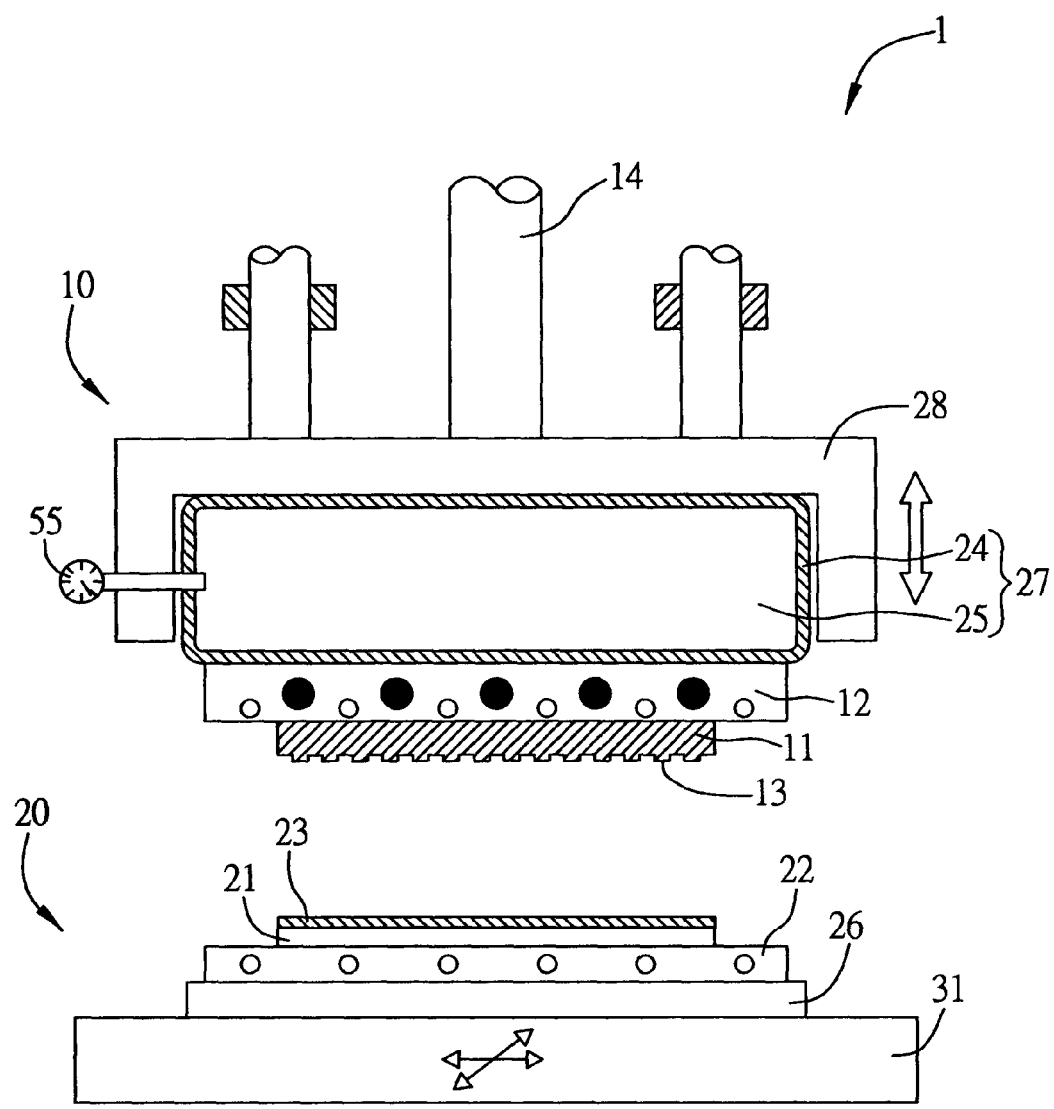
FIG. 2 is a schematic view of a parallelism adjustment device according to a second embodiment of the invention.
Figure 3A:
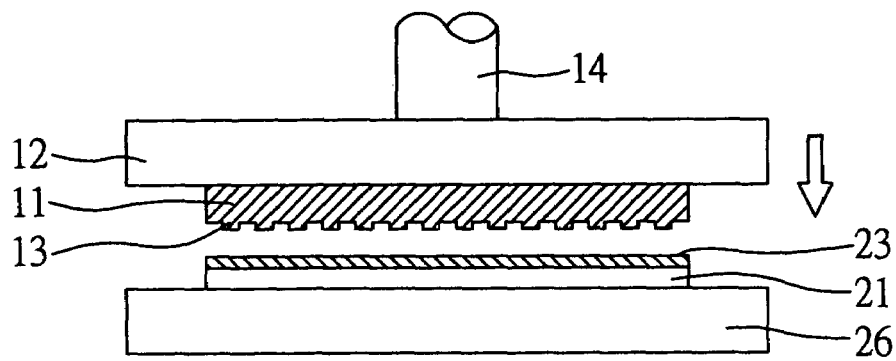
FIG. 3A through to FIG. 3C (PRIOR ART) are schematic views illustrating the nano-imprint lithography process.
Figure 3B:
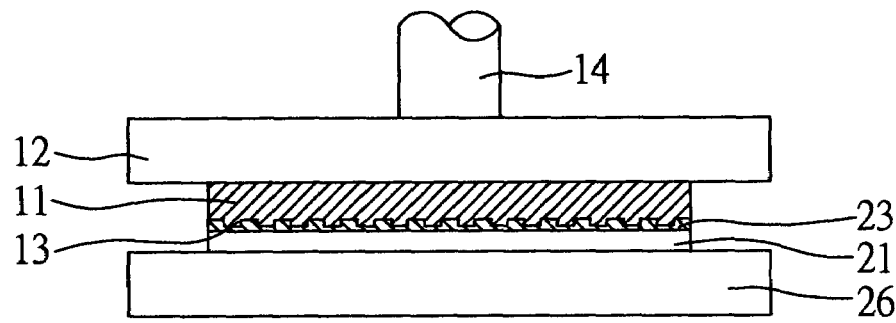
Figure 3C:
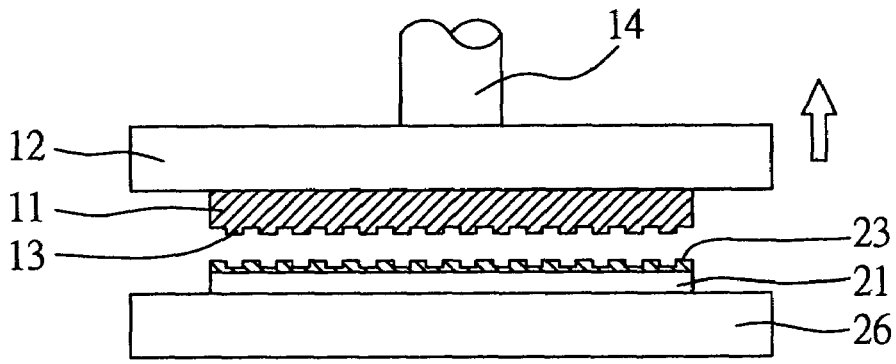
Figure 4:
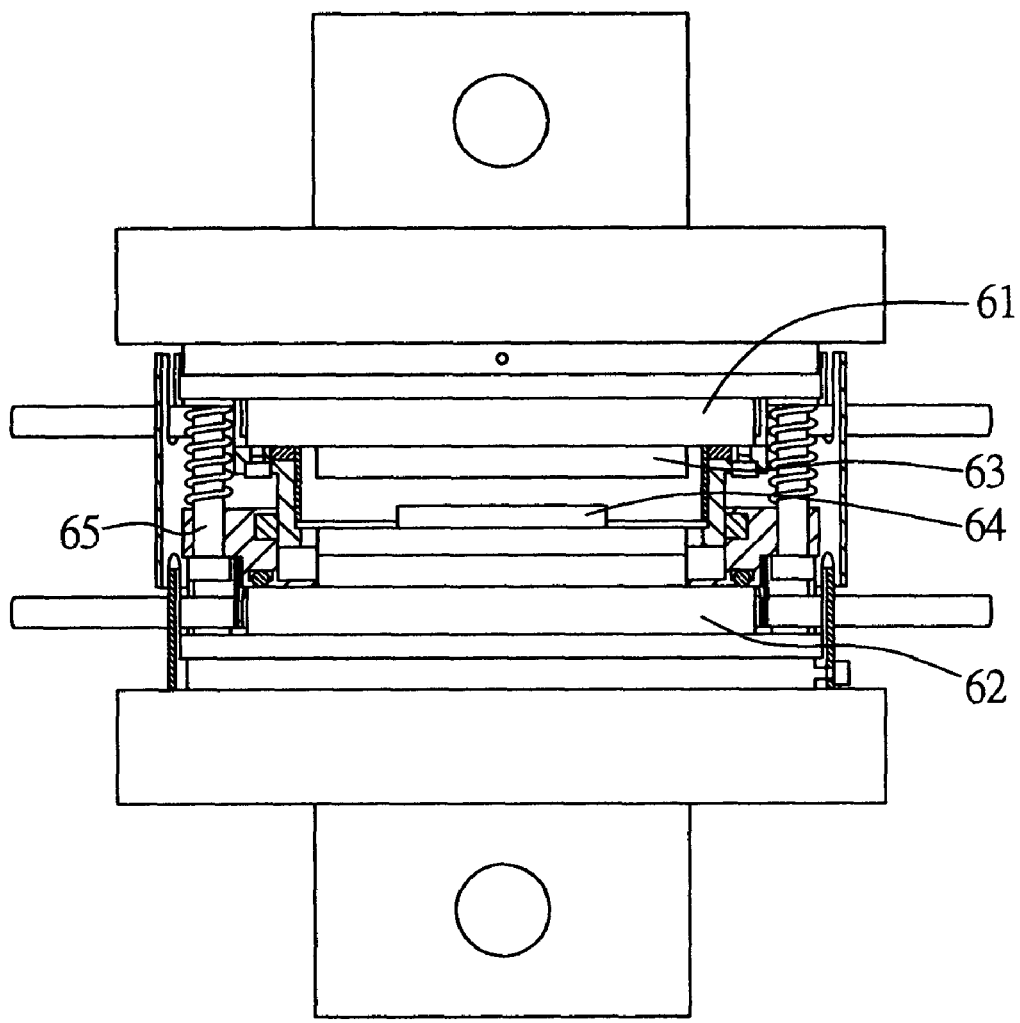
FIG. 4 (PRIOR ART) is a schematic view of a nano-imprint device disclosed in U.S. Pat. No. 5,993,189.
Figure 5:
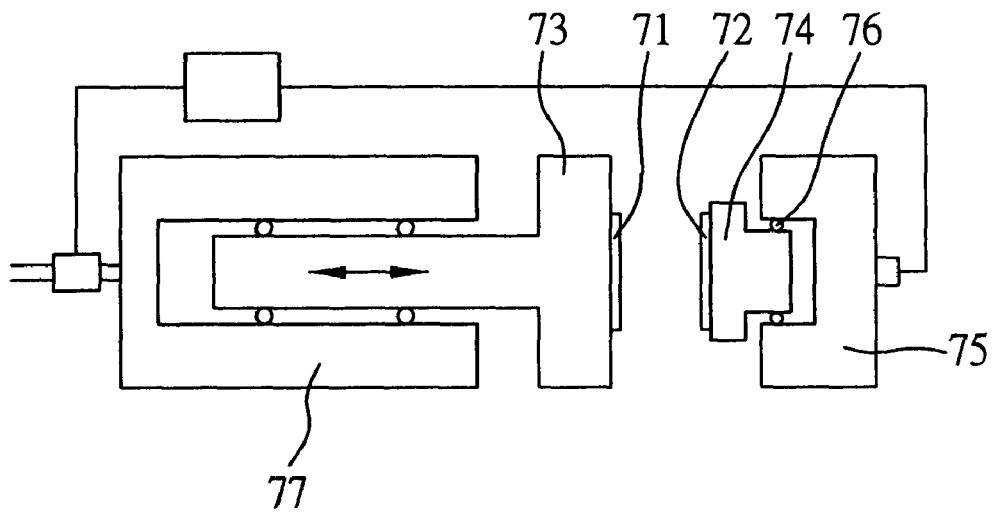
FIG. 5 (PRIOR ART) is a schematic view of a nano-imprint device disclosed in PCT Patent No. WO 0169317.
Figure 6:
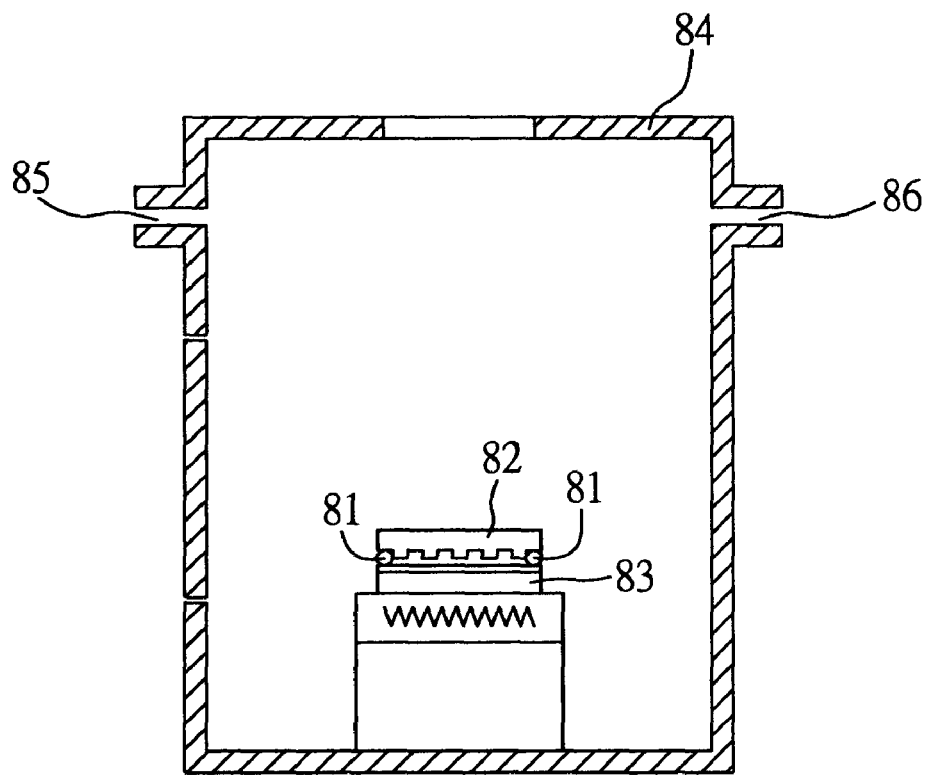
FIG. 6 (PRIOR ART) is a schematic view of a nano-imprint device disclosed in U.S. Pat. No. 6,482,742.
Figure 7:
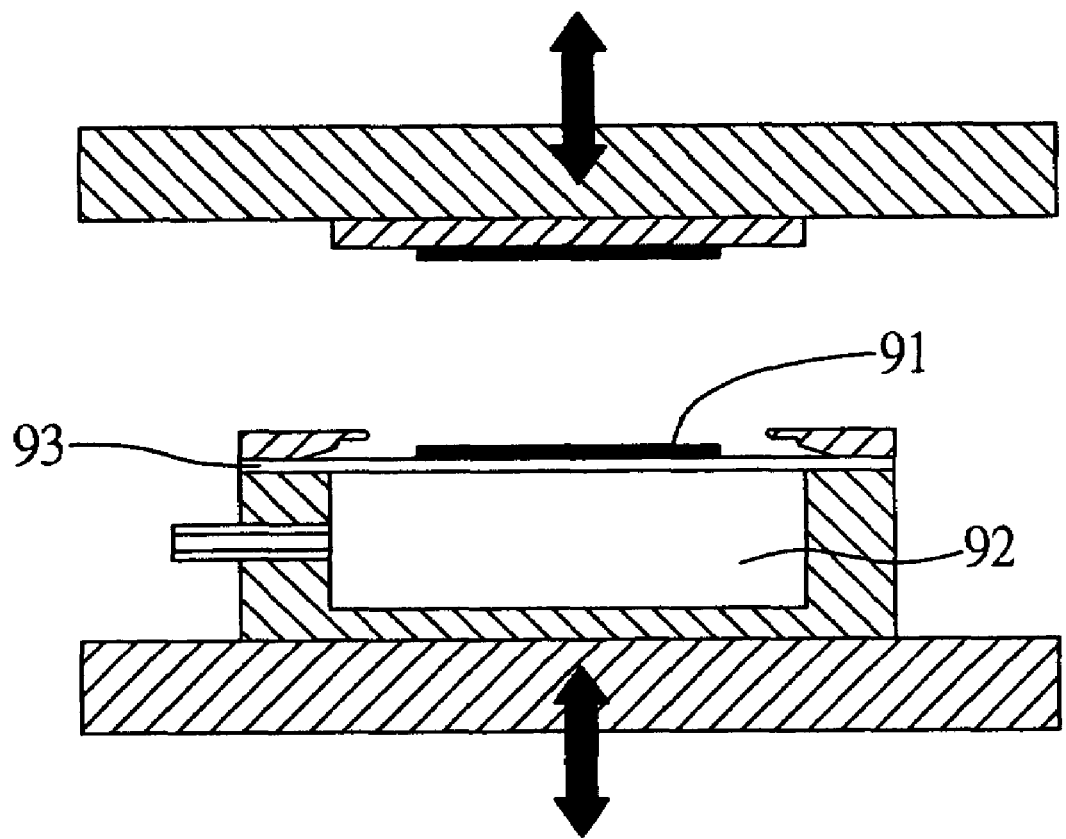
FIG. 7 (PRIOR ART) is a schematic view of a nano-imprint device disclosed in PCT Patent No. WO 0142858.

FIG. 2 is a schematic view of a parallelism adjustment device according to a second embodiment of the invention. The parallelism adjustment device in this embodiment is similar to that described in the first embodiment of the invention, except that the parallelism adjustment mechanism 27 is mounted on the imprint unit 10 to achieve the same parallelism adjustment. According to the design, the imprint unit 10 is provided with a positioning plate 28. And the resilient film 24 is located between the positioning plate 28 and the first molding plate 12, such that the mold 11 of the imprint unit 10 is adjusted via the force of contact formed between the mold 11 and the substrate 21 and flexibility of the resilient membrane 24 to achieve parallelism and uniform pressure distribution. Since the components are arranged in a similar way to that described in the first embodiment, the detail is omitted herein.

In a further embodiment (not shown), the resilient film 24 can be mounted both on the imprint unit 10 and the carrier unit 20. That is, resilient film 24 is mounted between the positioning plate 28 and the first molding plate 12, and between the second molding plate 26 and the suction plate 22. Moreover, construction of the invention is not limited to the above description. For example, the substrate 21 may be mounted on the imprint unit 10 and the mold 11 may be mounted on the carrier unit 20. Meanwhile, a positioning platform 31 that enhances positioning of the mold 11 of the imprint unit 10 may be further provided to increase precision of positioning in the imprint lithography.

As described above, the parallelism adjustment device applicable to the nano-imprint lithography according to the invention significantly mitigate the problems associated with the prior art. The resilient film provides parallelism adjustment and the fluid therein provides uniform pressure distribution without the need of any additional driving sources for parallelism adjustment. Thereby, processing and assembly errors can be reduced, and problems caused from vibration of the driving source are prevented. Furthermore, the invention provides advantages, such as simple construction, low production cost, rapid response and low operation complexity.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A parallelism adjustment device applicable to nano-imprint lithography, the device comprising:

an imprint unit at least having a first molding plate and an imprint mold mounted on the first molding plate;

a carrier unit at least having a second molding plate, a suction plate mounted on the second molding plate, and a substrate mounted on the suction plate and held thereto using suction, wherein a moldable layer is coated on the substrate;

a parallelism adjustment mechanism comprising a hermetically enclosed resilient film and a predetermined amount of fluid filled therein, wherein the parallelism adjustment mechanism is coupled to at least one of the first and second molding plates; and a driving source for driving at least one of the imprint unit and the carrier unit, to allow the imprint mold to come into contact with the moldable layer to perform imprinting, and to allow the parallelism adjustment mechanism to be pressed via the contact between the imprint mold and the moldable layer so as to adjust parallelism for the imprint mold and the substrate with respect to each other.

2. The parallelism adjustment device of claim 1, wherein the parallelism adjustment mechanism is mounted between the first molding plate and the imprint mold if the parallelism adjustment mechanism is coupled to the first molding plate, so as to adjust parallelism of the imprint mold when the parallelism adjustment mechanism is pressed.

3. The parallelism adjustment device of claim 1, wherein the parallelism adjustment mechanism is mounted between the second molding plate and the substrate if the parallelism adjustment mechanism is coupled to the second molding plate, so as to adjust parallelism of the substrate when the parallelism adjustment mechanism is pressed.

4. The parallelism adjustment device of claim 1, wherein the resilient film of the parallelism adjustment mechanism is made of one selected from the group consisting of rubber, plastic, other polymeric materials, and flexible structures.

5. The parallelism adjustment device of claim 1, wherein the parallelism adjustment mechanism further comprises a pressure sensor for sensing a pressure applied to the parallelism adjustment mechanism, so as to conduct instant pressure detection.

6. The parallelism adjustment device of claim 1, wherein a positioning platform is coupled to at least one of the imprint unit and the carrier unit, so as to facilitate positioning during imprinting.

7. The parallelism adjustment device of claim 1, wherein the driving source is a transmission unit composed of a linear motor and a hydraulic cylinder, or composed of a server motor and a ball screw rod.

8. The parallelism adjustment device of claim 1, wherein the moldable layer is made of one selected from the group consisting of a polymer, a metal, and a non-metal material.

9. The parallelism adjustment device of claim 1, wherein an anti-adhesion layer is coated over the moldable layer and the imprint mold respectively.

10. The parallelism adjustment device of claim 1, wherein the imprint mold and the substrate are mounted on the imprint unit and the carrier unit respectively by means of vacuum suction force, mechanical force, or electromagnetic force.

11. The parallelism adjustment device of claim 1, wherein a heating member is mounted on the imprint unit and the carrier unit to achieve a pre-determined operation temperature during imprinting.

12. The parallelism adjustment device of claim 1, wherein a cooling member is mounted on the imprint unit and the carrier unit to achieve a pre-determined reduced temperature after imprinting.

* * * * *